United States Patent [19]

Sawatari et al.

[11] 4,268,433
[45] May 19, 1981

[54] 1,2-POLYBUTADIENE COMPOSITIONS AND CURED FLAME RETARDED 1,2-POLYBUTADIENE RESIN MATERIALS

[75] Inventors: Norio Sawatari; Isao Watanabe, both of Kawasaki; Kazumasa Saito, Atsugi; Katsura Adachi, Sagamihara, all of Japan

[73] Assignee: Fujitsu Limited, Tokyo, Japan

[21] Appl. No.: 70,609

[22] Filed: Aug. 29, 1979

[30] Foreign Application Priority Data

Aug. 29, 1978 [JP] Japan .............................. 53-104455
Aug. 29, 1978 [JP] Japan .............................. 53-105174
Mar. 24, 1979 [JP] Japan .............................. 54-34913
Mar. 24, 1979 [JP] Japan .............................. 54-34914
Mar. 24, 1979 [JP] Japan .............................. 54-34917
Mar. 24, 1979 [JP] Japan .............................. 54-34918

[51] Int. Cl.³ .......................... C08L 33/16; C08L 9/00
[52] U.S. Cl. ................................. 525/193; 525/209; 525/225; 525/226; 525/282; 525/288; 525/292; 525/256; 525/263; 525/194; 525/205; 525/291; 525/300; 525/303; 525/305; 525/310
[58] Field of Search ............... 525/209, 225, 226, 282, 525/288, 292; 260/45.75, 45.85

[56] References Cited

U.S. PATENT DOCUMENTS

| | | | |
|---|---|---|---|
| 2,925,407 | 2/1960 | Goldberg | 525/282 |
| 3,153,014 | 10/1974 | Fletcher et al. | 525/282 |
| 3,925,275 | 12/1975 | Musashi et al. | 525/288 |
| 4,058,658 | 11/1977 | Morgan et al. | 525/209 |
| 4,108,943 | 8/1978 | Lee | 525/288 |

FOREIGN PATENT DOCUMENTS 53-55393  5/1978  Japan .

*Primary Examiner*—Carman J. Seccuro
*Attorney, Agent, or Firm*—Staas & Halsey

[57] ABSTRACT

Flame retardation of 1,2-polybutadiene based upon the use of halogenated bisphenol bisacrylate reactive flame retardants, for example, 2,2-bis(4-methacryloyl-3,5-dibromophenyl)-propane. Flame retardancy performance of UL 94 V-0 or V-1 has been achieved without impairing desirable dielectric properties and heat resistance inherently possessed by 1,2-polybutadiene. If an aromatic bismaleimide modifier, for example, N,N'-4,4'-diphenylmethane bismaleimide, is jointly used, a thermal expansion coefficient less than a half of the thermal expansion coefficient of cured 1,2-polybutadiene can be achieved.

26 Claims, 1 Drawing Figure

1,2-POLYBUTADIENE COMPOSITIONS AND CURED FLAME RETARDED 1,2-POLYBUTADIENE RESIN MATERIALS

BACKGROUND OF THE INVENTION

1. Field of the Invention

The present invention relates to 1,2-polybutadiene compositions curable to flame retarded resin materials and to cured flame retarded 1,2-polybutadiene resin materials. The cured products in accordance with the invention exhibit an improved flame retardancy performance over the cured 1,2-polybutadiene, while retaining desirable properties of the cured 1,2-polybutadiene, such as high heat resistance and excellent dielectric properties. Preferred cured products in accordance with the invention further exhibit a thermal expansion coefficient lower than that of the cured 1,2-polybutadiene.

2. Description of the Prior Art

Because of their excellent electrical properties, in particular dielectric properties, and excellent resistances to heat, water and chemicals, 1,2-polybutadiene and cured products thereof are widely used in parts of electrical and electronic devices and equipment as a substrate of a printed circuits board, a coating resin for printed circuits, a molding compound or an insulating varnish. Nevertheless, 1,2-polybutadiene and cured products thereof have a drawback in that they are readily burnable since their molecules are solely composed of hydrogen and carbon atoms.

For parts of electrical and electronic devices and equipment, a certain level of flame retardancy performance has been recently required as a standard, and the flame retardation of 1,2-polybutadiene has now been one of the most important problems in the art. Most of the prior art approaches for the flame retardation of 1,2-polybutadiene are unsatisfactory in that a sufficient flame retardancy performance is not achieved or can only be achieved with the sacrifice of desirable properties inherently possessed by 1,2-polybutadiene. For example, methods for the flame retardation of 1,2-polybutadiene based on the use of addition-type flame retardants, such as hexabromobenzene, decabromodiphenyl ether and triphenyl phosphate, optionally together with auxiliary flame retardants, such as antimony trioxide and triphenylantimony, result not only in impairment of desirable dielectric properties and heat resistance inherently possessed by 1,2-polybutadiene, but also in undesirable bleeding out of the flame retardant to the surfaces of the cured resin.

On the other hand, methods for the flame retardation of 1,2-polybutadiene based on the use of reactive flame retardants, such as 2,4,6-tribromophenylacrylate or -methacrylate, are proposed in Japanese Patent Laid-open Specifications 50-30,019, published on Mar. 26, 1975, and 50-32,241, published on Mar. 28, 1975, as well as in examined Japanese Patent Publication 53-21,433, published on July 3, 1978. By these methods, however, the flame retardancy performance is not durable although the initial level of flame retardancy performance is satisfactory. Furthermore, while the desirable dielectric properties of 1,2-polybutadiene can be retained, the high heat resistance inherently possessed by 1,2-polybutadiene is adversely affected.

SUMMARY OF THE INVENTION

Accordingly, a primary object of the invention resides in the flame retardation of 1,2-polybutadiene without the sacrifice of desirable electrical and other properties inherently possessed by 1,2-polybutadiene.

Thus, in accordance with one aspect of the invention there is provided a composition curable to a flame retarded resin material, which comprises:

A. a butadiene polymer wherein at least 50% of the recurring units consist of 1,2-butadiene units;

B. 40 to 200 parts by weight, based on 100 parts by weight of said butadiene polymer, of at least one reactive flame retardant selected from the group consisting of bisphenol bisacrylate compounds having the formula:

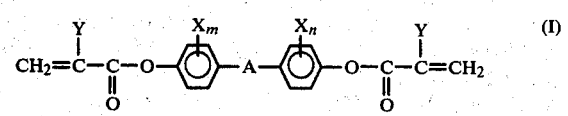

wherein X represents Br or Cl, Y represents H or —CH$_3$, and m and n each is an integer from 1 to 4, and A represents a direct bond —O—, —CO—, —SO$_2$—, —(CH$_2$)$_b$—, wherein b is an integer from 1 to 4, —CH=CH—

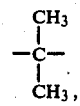

polymers of such bisphenol bisacrylate compounds; and

C. a curing-promoting amount of an organic peroxide. A preferred composition further comprises:

D. 10 to 150 parts by weight, based on 100 parts by weight of said butadiene polymer, of at least one modifier selected from the group consisting of bismaleimide compounds having the formula:

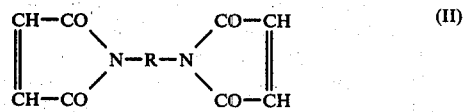

wherein R represents a divalent aromatic radical having up to 70 carbon atoms, and polymers of such bismaleimide compounds.

In accordance with another object of the invention there is provided a cured flame retarded resin material exhibiting a flame retardancy performance of V-1 or V-0, as measured according to the Underwriters Laboratories Standard UL 94 using the Vertical Burning Test, which material is obtained by curing the composition of the invention.

A preferred resin material has a thermal expansion coefficient of less than $1 \times 10^{-4}/°$ C. and is obtained by curing the preferred composition.

The cured resin material in accordance with the invention can be in the form of a prepreg laminate.

DETAILED DESCRIPTION OF THE PREFERRED EMBODIMENTS

Figure 1:
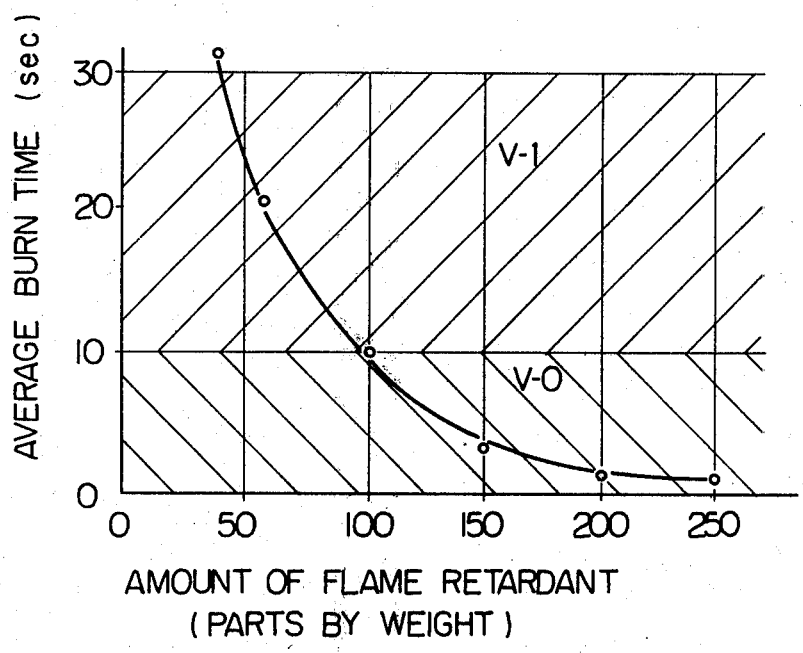
FIG. 1 shows the average burn time as a function of the amount of flame retardant.

The essential component A of the composition according to the invention is a butadiene polymer wherein at least 50%, preferably at least 80%, of the recurring units consist of 1,2-butadiene units of the formula:

$$-CH_2-CH- \atop {\underset{\underset{CH_2}{\|}}{CH}}$$

Such a butadiene polymer is cross-linkable due to the presence of the double bond in each 1,2-butadiene unit. The molecular weight of the butadiene polymer is not critical. Commercially available 1,2-polybutadiene products, including normally liquid products having a number-average molecular weight of 1000 to 5000 and normally solid products having a number-average molecular weight of 50000 to 200000 and a melting point of 50° to 200° C., are usable in the practice of the invention. The structural units of the butadiene polymer, other than the 1,2-butadiene units, may be 1,4-butadiene or epoxidized 1,2-butadiene units. An epoxidized 1,2-polybutadiene obtainable by partial epoxidation of 1,2-polybutadiene and having the formula:

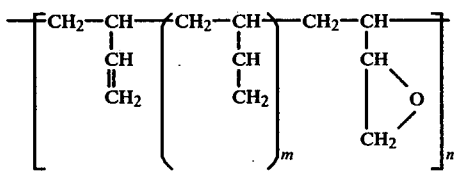

wherein n is an integer of at least 1 and preferably from 4 to 200, m is an integer from 1 to 20, and when n is more than 1, the m's may be equal or different, and having an epoxy equivalency of 150 to 550, has been found to be also useful in the practice of the invention. Such an epoxidized 1,2-polybutadiene is also commercially available, and can be used alone or in combination with other 1,2-polybutadiene products.

The essential component B of the composition according to the invention is a reactive flame retardant selected from the bisphenol bisacrylate compounds of the formula (I) and polymers thereof. Examples of the compounds of the formula (I) include, for example, the following.

2,2-bis(4-methacryloyl-3,5-dibromophenyl)propane,
2,2-bis(4-acryloyl-3,5-dibromophenyl)propane,
2,2-bis(4-methacryloyl-3,5-dichlorophenyl)propane,
2,2-bis(4-acryoyl-3,5-dichlorophenyl)propane,
4,4'-diacryloyl-3,3',5,5'-tetrabromodiphenylsulfon,
4,4'-dimethacryloyl-3,3'-dichlorodiphenylsulfon,
4,4'-dimethacryloyl-3,3',5,5'-tetrabromodiphenylmethane,
4,4'-dimethacryloyl-3,3'5,5'-tetrabromodiphenylketone,
4,4'-dimethacryloyl-3,3'-dibromodiphenylbutane,
4,4'-dimethacryloyl-2,2', 3,3',5,5',6,6'-octachlorophenyl ether, and
4,4'-diacryloyl-3,3'5,5'-tetrachlorodiphenyl Preferred reactive flame retardants are bisphenol bisacrylate compounds of the formula (I'):

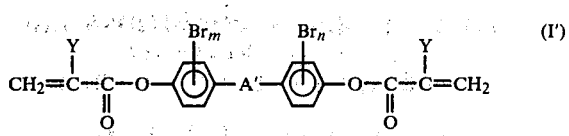

wherein A' is —SO$_2$— or $$-\underset{\underset{CH_3}{|}}{\overset{\overset{CH_3}{|}}{C}}-$$

and Y, m and n have the same meanings as defined above with respect to the formula (I), and polymers of such bisphenol bisacrylate compounds. The most preferred reactive flame retardant is 2,2-bis(4-methacryloyl-3,5-dibromophenyl)propane or its polymer.

The reactive flame retardants used in the invention are known in the art and described in Japanese Patent Laid-open Specification 53-55393, published on May 19, 1978. However, this laid-open specification states that satisfactory results are not obtained when the bisphenol bisacrylate compounds are used as a sole flame retardant, and is completely silent with respect to the flame retardation of 1,2-polybutadiene.

The reactive flame retardant must be used in an amount of 40 to 200 parts, preferably 60 to 120 parts by weight, based on 100 parts by weight of the butadiene polymer. In a series of experiments according to the general procedure described in Example 1, the amount of the reactive flame retardant used, 2,2-bis(4-methacryloyl-3,5-dibromophenyl)propane, was varied. The average burn time, measured in accordance with the Underwriters Laboratories Standard UL 94 using the Vertical Burning Test on the cured samples, was plotted against the amount of the flame retardant. The results are shown in FIG. 1. From these results and in view of the fact that the dielectric properties of the cured product tend to be adversely affected when the amount of the flame retardant substantially exceeds 200 parts by weight based on 100 parts by weight of the 1,2-polybutadiene, we have selected the above-mentioned proportion of the reactive flame retardant.

The essential component C is an organic peroxide. Those known for the curing of 1,2-polybutadiene can be used in the practice of the invention in known amounts. Illustrative of typical organic peroxides are benzoyl peroxide, 1,1-bis(t-butylperoxy)-3,3,5-trimethylcyclohexane, dicumyl peroxide, t-butylperoxy benzoate, t-butylperoxyoxide, di-t-butylperoxydi-isopropyl benzene, and 2,5-dimethyl-2,5-di-t-butylperoxyhexine-3.

In addition to the above-mentioned components A, B and C, the curable composition according to the invention may contain other curable polymers, such as epoxy resin, in an amount of up to 20% by weight of the butadiene polymer.

A minor part of the reactive flame retardant may be replaced by other reactive flame retardants, such as tribromophenyl acrylate or methacrylate, and/or addition-type flame retardants may be jointly used, although such modifications are not preferred.

When an epoxidized 1,2-polybutadiene and/or an additional epoxy resin is used, the composition may contain a curing agent, such as an acid anhydride or polyamine, normally used for the curing of epoxy resins.

The composition may further contain up to 10% by weight of a styrene derivative, such as styrene, chlorostyrene, ethylvinylbenzene and divinylbenzene. Addition of such a styrene derivative has been found effective not only in reducing the viscosity of the composition but also in shortening the required cure time.

In preferred embodiments, the curable composition contains up to 150 parts by weight, based on 100 parts by weight of the butadiene polymer, of a modifier selected from the bismaleimide compounds of the formula (II) and polymers of such bismaleimide compounds. In these preferred embodiments, a thermal expansion coefficient lower than that of the cured 1,2-polybutadiene ($2.2\times10^{-4}/°$ C.) can be achieved while enjoying the advantages of the invention. Preferred modifiers are bismaleimide compounds having the formula (II'):

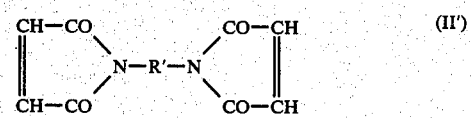

wherein R' represents a divalent aromatic radical selected from the group consisting of

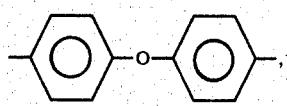

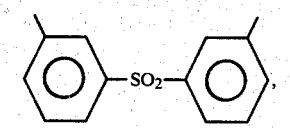

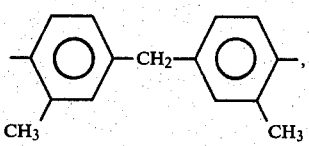

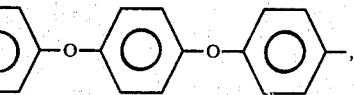

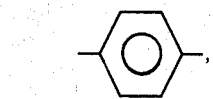

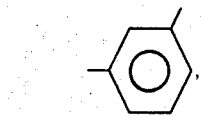

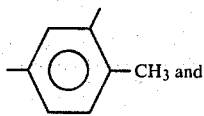  —CH₃ and

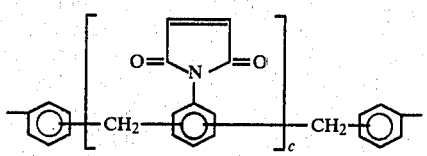

wherein c is an integer from 0 to 5, and polymers of such bismaleimide compounds.

Illustrative of the bismaleimides are:
N,N'-m-phenylene-bismaleimide,
N,N'-p-phenylene-bismaleimide,
N,N'-4,4'-diphenylmethane-bismaleimide,
N,N'-4,4'-diphenylsulfon-bismaleimide, and;
N,N'-4,4'-m-xylene-bismaleimide.

These bismaleimides may be prepared according to the process described in U.S. Pat. No. 2,444,536. Equimolar reaction products of these bismaleimides with aromatic diamines, having a melting point ranging between 50 and 200° C., may also be used as the modifier. Another example of the useful bismaleimide is a poly(phenylmethylene)polymaleimide of the formula:

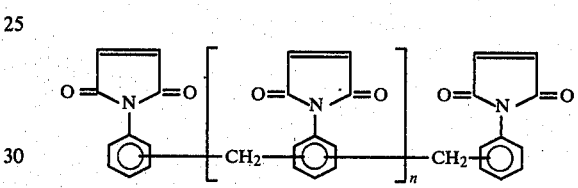

wherein n is an integer from 0 through 5.

In order to achieve a significantly reduced thermal expansion coefficient, the modifier should be used in an amount of at least 10 parts by weight based on 100 parts by weight of the butadiene polymer. The use of an excessive amount of the modifier should be avoided, or otherwise the desirable electrical properties possessed by 1,2-polybutadiene will be impaired. Normally we prefer to use 30 to 100 parts of the modifier based on the weight of the butadiene polymer.

The curable composition of the invention may be in the form of a varnish with the ingredients dissolved in a suitable solvent, such as toluene, tetrahydrofuran and trichloroethylene.

While the curable composition according to the invention can be used in casting and molding shaped articles, it is particularly useful for the production of prepreg laminate, and copper clad laminate. In such applications, a fibrous reinforcing sheet, such as a glass cloth, glass mat, glass paper, glass non-woven fabric, woven or non-woven fabric of synthetic fibers or asbestos sheet, may be impregnated with the composition of the invention in the form of varnish, and dried at a temperature of 50 to 200° C., preferably 80° to 150° C., to form a non-tacky prepreg. A plurality of such prepregs may be stacked, optionally sandwiched between copper foils, and then cured to a prepreg laminate or copper clad laminate at a temperature of 100° to 200° C. and a pressure of 1 to 100 kg/cm². Thus, the curable composition may be in the form of prepreg, and the cured resin material may be in the form of prepreg laminate.

The cured resin material of the invention exhibits a flame retardancy performance of V-1 or V-0, as measured according to the Underwriters Laboratories Standard UL 94 using the Vertical Burning Test, while retaining desirable electrical properties and heat resistance inherently possessed by 1,2-polybutadiene. This was unexpected and surprising when compared with the results obtained in Control 2, wherein a mono-functional reactive flame retardant, 2,4,6-tribromophenyl acrylate was used. Because of its monofunctionality, this flame retardant significantly reduces the crosslinking density of 1,2-polybutadiene, and the tribromophenyl groups are present in the cured product as pendants without forming a part of the crosslinking chain. It is believed that for these reasons, the thermal stability of 1,2-polybutadiene is impaired. Furthermore, the flame retardant in itself has a thermal decomposition temperature of about 160° C., which is much lower than that of 1,2-polybutadiene (about 315° C.). Accordingly, it is believed that the flame retarding moieties in the cured product will start to decompose at a temperature much lower than the temperature at which the 1,2-polybutadiene moieties in the cured product begin to decompose. Upon first ignition of the sample, non-flammable gases would evolve before quantities of flammable gases evolve, and thus the sample would be self-extinguishing. Whereas upon second ignition, the non-flammable gases would have already been consumed, and thus the sample would be burning. In contrast, the flame retardant used in the invention is difunctional, and thus, the flame retarding groups enter the crosslinking chain. For this reason it is believed that the thermal stability of 1,2-polybutadiene would not be adversely affected. Furthermore, the flame retardant, 2,2-bis(4-methacryloyl-3,5-dibromophenyl)propane, has a thermal decomposition temperature of about 280° C., which is close to that of 1,2-polybutadiene (315° C.). Accordingly, it is believed that temperatures at which non-flammable gases evolve from flame retarding moieties would not significantly differ from temperatures at which flammable gases evolve from 1,2-polybutadiene moieties, and thus, the relative proportion of both non-flammable and flammable gases could be maintained relatively constant, and the sample would be self-extinguishing upon second ignition as well.

The invention will be further described by the following Examples and Controls, in which parts are by weight unless otherwise specified.

EXAMPLE 1

Liquid casting compositions Nos. 1 through 6 were prepared by mixing a low molecular weight atactic 1,2-polybutadiene ("NISSO-PB-B3000" provided by Nippon Soda Co., Ltd., wherein at least 90% of the recurring units consist of 1,2-butadiene units and which has a number-average molecular weight of about 3000), styrene, dicumyl peroxide ("Percumyl D" provided by Nippon Oil & Fats Co., Ltd.), 2,2-bis(4-acryloyl-3,5-dibromophenyl) propane (hereinafter referred to as Compound A) and 2,2-bis(4-methacryloyl-3,5-dibromophenyl) propane (hereinafter referred to as Compound B), in respective amounts (parts by weight) as indicated in Table 1.

Each composition was poured into a space formed by two "Teflon" (in the following the names in quotations comprise trademarks) surfaces arranged in parallel and spaced apart from each other by a distance of about 1.6 mm, and heated for 5 hours in total at temperatures of 120° C., 130° C., 140° C., 150° C. and 16° C. one hour at each temperature) to form a cured sheet.

The properties obtained from the cured sheets of these compositions are recorded in Table 1. The flame retardancy performance was measured according to the Underwriters Laboratories Standard UL94 using the Vertical Burning Test on samples which had been cut from the cured sheets and had a thickness of 1.6 mm±0.2 mm, a width of 12.7±0.5 mm and a length of 127±1 mm. Five samples were used for one test.

The thermal decomposition temperature, at which loss in weight of the polymer begins, was determined from TG curves obtained by thermal gravimetric analysis on finely divided samples with a heating rate of 10° C./min.

The dielectric constant was measured by a mutual induction bridge method in accordance with JIS K 6911.

TABLE 1

| Composition No. | 1 | 2 | 3 | 4 | 5 | 6 |
|---|---|---|---|---|---|---|
| 1,2-Polybutadiene | 100 | 100 | 100 | 100 | 100 | 100 |
| Styrene | 0 | 0 | 0 | 0 | 20 | 0 |
| Compound A | 0 | 0 | 0 | 0 | 0 | 100 |
| Compound B | 0 | 40 | 60 | 100 | 72 | 0 |
| Dicumylperoxide | 4 | 5.6 | 6.4 | 8 | 8 | 8 |
| Flame retardancy (UL-94) | B | HB | V-1 | V-0 | V-1 | V-0 |
| Dielectric constant (1 MHZ) | 2.4 | 2.6 | 2.6 | 2.8 | 2.7 | 2.8 |
| Thermal decomposition temp. (°C.) | 315 | 310 | 302 | 302 | 310 | 305 |

From the results shown in Table 1, it is revealed that the flame retardancy performance of the cured resin is enhanced as the proportion of Compound A and/or B increases; that when compared with the cured resin consisting of 1,2-polybutadiene, the dielectric constant of the cured resins according to the invention does not substantially increase, and that the heat resistance of the cured resin reflected by the thermal decomposition temperature is slightly but not significantly lowered by the addition of the flame retardant. The addition of styrene appears preferable in reducing the lowering of the heat resistance.

EXAMPLE 2

Curable compositions Nos. 7 through 10 were prepared by mixing a high molecular weight syndiotactic 1,2-polybutadiene ("JSR-RB 810" provided by Japan Synthetic Rubber Co., Ltd. wherein at least 90% of the recurring units consist of 1,2-butadiene units and which has a number-average molecular weight of about 120000), Compound B and 2,5-dimethyl-2,5-di-t-butylperoxyhexane ("Perhexine 25B" provided by Nippon Oil & Fats Co., Ltd.) in respective parts by weight as indicated in Table 2, and milling on a roll mill at temperatures of 140° to 150° C. Each composition was pressed in a mold at a temperature of 200° C. for 2 hours to form a cured sheet of about 1.6 mm in thickness. Strips of 127±1 mm in length and 12.7 mm±0.5 mm in width were cut from the sheets for the burning test.

The properties of the cured sheets were tested in the manner as described in Example 1. The results are shown in Table 2.

TABLE 2

| Composition No. | 7 | 8 | 9 | 10 |
|---|---|---|---|---|
| 1,2-Polybutadiene | 100 | 100 | 100 | 100 |
| Compound B | 0 | 40 | 60 | 100 |
| Perhexine 25 B | 2 | 2.8 | 3.2 | 4 |
| Flame retardancy (UL-94) | B | HB | V-1 | V-0 |
| Dielectric Constant (1 MHZ) | 2.5 | 2.7 | 2.7 | 2.8 |
| Thermal decomposition temp. (°C.) | 310 | 300 | 302 | 300 |

Tables 1 and 2 reveal that cured resins exhibiting an enhanced flame retardancy performance can be obtained from both low and high molecular weight 1,2-polybutadiene materials.

EXAMPLE 3

Following the procedure described in Example 1, a cured resin sheet was prepared from Composition No. 4 except that the Compound B in Composition No. 4 was replaced with the same amount of 4,4'-dimethacryloyl-3,3/,5,5'-tetrabromodiphenylmethane. The cured resin sheet exhibited a flame retardancy performance of UL 94 V-O and had similar dielectric constant and thermal decomposition temperature to those obtained from Composition No. 4.

EXAMPLE 4

Following the procedure described in Example 1, Composition No. 4 was cast into a cured sheet, but the Compound B in Composition No. 4 was replaced by the same amount of an equiweight mixture of 4,4'-dimethacryloyl-3,3',5,5'5tetrabromodiphenylsulfon and 4,4'-dimethacryloyl-3,3'-dibromodiphenylmethane. Similar results were obtained.

EXAMPLE 5

A mixture of 40 parts of syndiotactic 1,2-polybutadiene ("JSR-RB 810"), 40 parts of N,N'-4,4'-diphenylmethane bismaleimide, 20 parts of Compound B and 5 parts of dicumyl peroxide was milled on a roll mill at a temperature of 105° C. After cooling, the mixture was finely divided and then hot-pressed in a closed mold at 180° C. for 2 hours and after-cured at 200° C. for 2 hours to form a cured resin board having a dimension of 3 mm×100 mm×100 mm.

As measured in accordance with JIS K 6911, the cured resin board had a dielectric constant of 2.88 (1 MHZ, 25° C.), a dielectric loss tangent of 0.007 (1 MHZ, 25° C.) and a water absorption of 0.13% by weight. The thermal expansion coefficient as measured by a light interference method (25°-300° C.) was $4.9 \times 10^{-5}$/° C. According to the Underwriters Laboratories Standard using the Vertical Burning Test, it was rated as UL 94 V-1 with an average burn time of 15.2 seconds and a maximum burn time of 23.0 seconds.

For a comparative purpose, a mixture of 40 parts of the 1,2-polybutadiene, 40 parts of the bismaleimide and 2.4 g of the peroxide was processed to prepare a cured resin board, which was tested in the same manner. While the product had a dielectric constant of 2.80 (1 MHZ, 25° C.), a dielectric loss tangent of 0.006 (1 MHZ, 25° C.) and a water absorption of 0.14% by weight, it was rated as "Burning" in accordance with the UL 94 test.

EXAMPLE 6

The processing and test procedures as described in Example 5 were repeated except that the bismaleimide modifier used in Example 5 was replaced with the same amount of a product which had been obtained by reacting the bismaleimide with 4,4'-diaminodiphenylmethane. The cured resin board exhibited a dielectric constant of 2.86 (1 MHZ, 25° C.), a dielectric loss tangent of 0.006 (1 MHZ, 25° C.), a water absorption of 0.11% by weight, and a thermal expansion coefficient of $5.2 \times 10^{-5}$/° C., and was rated as UL 94 V-1 with an average burn time of 12.8 seconds and a maximum burn time of 19.5 seconds.

EXAMPLE 7

The processing and test procedures as described in Example 5 were repeated except that the bismaleimide modifier used in Example 5 was replaced with the same amount of "Bismaleimide M", supplied by Mitsui Toatsu Chemical Co., Ltd. and being a poly(phenylmethylene)polymaleimide of the formula:

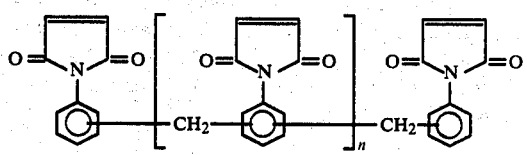

wherein n is an integer from 0 through 5, according to the supplier's information. The cured resin board so obtained exhibited a dielectric constant of 2.85 (1 MHZ, 25° C.), a dielectric loss tagent of 0.006 (1 MHZ, 25° C.), a water absorption of 0.11% by weight and a thermal expansion coefficient of $5.4 \times 10^{-5}$/° C., and was rated as UL 94 V-1 with an average burn time of 13.4 seconds and a maximum burn time of 21.0 seconds according to the UL Standard Vertical Burning Test.

For a comparative purposes the procedures of Example 5 were repeated except that the bismaleimide modifier was omitted and the peroxide was used in an amount of 2.4 parts instead of 5 parts. The product had a thermal expansion coefficient of $2.0 \times 10^{-4}$/° C., while its other properties tested were comparable to those of the products obtained using the bismaleimide modifiers.

EXAMPLE 8

A mixture of 50 parts of an epoxidized 1,2-polybutadiene having a number average molecular weight of about 1000 and an epoxy equivalent of about 200 ("BF-1000" provided by Adeka Argus Chemical Co., Ltd. and being obtainable by partial epoxidation of an atactic 1,2-polybutadiene in which at least 90% of the recurring units consist of 1,2-butadiene units), 30 parts of a bismaleimide prepolymer having a melting point of 80° C. ("KERIMID 601" provided by Rohne-Poulenc and being said to be obtainable by reaction of N,N'-4,4'-diphenylmethane bismaleimide with 4,4'-diaminodiphenylmethane), 30 parts of 2,2-bis(4-methacryloyl-3,5-dibromophenyl) propane, 5 parts of diethylaminopropylamine and 3 parts of dicumyl peroxide was milled on a roll mill at ambient temperature for 5 minutes to form a curable putty-like composition. The composition was compression-molded at a temperature of 160° C. and a pressure of 30 Kg/cm² for one hour into discs having a thickness of 3 mm and a diameter of 60 mm, and then post-cured at 200° C. for 2 hours.

The cured resin product was tested for various properties in the manner as described in Examples 1 and 5. The product exhibited a dielectric constant of 2.8, a dielectric loss tangent of 0.005, a water absorption of 0.12% by weight, a thermal expansion coefficient of $8.5 \times 10^{-5}$/° C. and a thermal decomposition temperature of 250° C., and was rated as UL 94 V-O in accordance the Underwriters Laboratories Standard using the Vertical Burning Test. While the Burning Test was conducted on samples of 60 mm in length, the samples were self-extinguished before the burning extended about 40 mm or less.

Example 9

The processing and test procedures as in Example 8 were repeated starting from a mixture of 40 parts of the epoxidized 1,2-polybutadiene used in Example 8, 40 parts of N,N'-4,4'diphenylmethane bismaleimide, 30 parts of 2,2-bis(4-methacryloyl-3,5-dibromophenyl)propane, 4 parts of diethylaminopropyl amine and 3 parts of dicumyl peroxide. The cured resin product exhibited a dielectric constant of 2.8, a dielectric loss tangent of 0.004, a water absorption of 0.10% by weight, a thermal expansion coefficient of $8.4 \times 10^{-5}/°$ C. and a thermal decomposition temperature of 250° C., and was rated as UL 94 V-1.

EXAMPLE 10

A mixture of 40 parts of the epoxidized 1,2-polybutadiene used in Example 8, 4 parts of diethylaminopropyl-amine, 20 parts of "Bismaleimide M" used in Example 7, 1.2 parts of dicumyl peroxide and 22 parts of 2,2-bis(4-methacryloyl-3,5-dibromophenyl)propane was stirred at a temperature of 50° C. to prepare a liquid homogeneous composition. The composition was poured into a "Teflon" mold maintained at a temperature of 100° C. and vacuum deareated. The mold was heated for 12 hours in total at temperatures of 150° C., 160° C., 170° C., 180° C., 190° C. and 200° C. (2 hours at each temperature) to form a cured resin board of 100 mm square and 3 mm thick. The cured resin product was tested for various properties in the manner as described in Examples 1 and 5. The product exhibited a dielectric constant of 3.10, a dielectric loss tangent of 0.007, a water absorption of 0.10% by weight, a thermal expansion coefficient of $7.1 \times 10^{-5}/°$ C. and a thermal decomposition temperature of 305° C., and was rated as UL 94 V-1 with an average burn time of 10.4 seconds and a maximum burn time of 15.1 seconds.

EXAMPLE 11

The processing and test procedures as described in Example 10 were repeated starting from a mixture of 35 parts of the epoxidized 1,2-polybutadiene, 11 parts of maleic anhydride, 15 parts of "Bismaleimide M", 1.2 parts of dicumyl peroxide and 18 parts of 2,2-bis(4-methacryloyl-3,5-dibromophenyl)propane. The cured resin product exhibited a dielectric constant of 3.12, a dielectric loss tangent of 0.006, a water absorption of 0.18% by weight, a thermal expansion coefficient of $6.8 \times 10^{-5}/°$ C. and a thermal decomposition temperature of 310° C., and was rated as UL 94 V-1 with an average burn time of 9.8 seconds and a maximum burn time of 13.2 seconds.

EXAMPLE 12

A varnish was prepared by dissolving 100 parts of a high molecular weight syndiotactic 1,2-polybutadiene ("JSR-PB 810), 100 parts of 2,2-ibs(4-methacryloyl-3,5-dibromophenyl)propane and 6 parts of dicumyl peroxide in 800 parts of trichloroethylene. A glass cloth substrate ("Nittobo WE-116E-103") provided by NITTO BOSEKI Co., Ltd) was impregnated with the varnish and dried at a temperature of 120° C. for 10 minutes to provide a non-tacky prepreg.

Eight prepregs so produced were stacked and cured for 2 hours to a prepreg laminate at a temperature of 200° C. and a pressure of 60 Kg/cm².

EXAMPLE 13

A glass cloth substrate ("Nittobo WE-116E-104") was impregnated with a varnish prepared from 100 parts of a high molecular weight syndiotactic 1,2-polybutadiene ("JSR-RB 810"), 30 parts of a low molecular weight atactic 1,2-polybutadiene ("NISSO-PB-B 1000" provided by Nippon Soda Co., Ltd., in which at least 90% of the recurring units consist of 1,2-butadiene units and which has a number-average molecular weight of about 1000), 100 parts of 4,4'-dimethacryloyl-3,3',5,5'-tetrabromodiphenylmethane,7 parts of 1,1-bis(t-butylperoxy)-3,3,5-trimethylcyclohexane and 650 parts of toluene, and dried at a temperature of 100° C. for 10 minutes to provide a non-tacky prepreg.

From 8 prepregs so obtained, a prepreg laminate was prepared in the same manner as described in Example 12.

EXAMPLE 14

A varnish was prepared by dissolving 100 parts of a high molecular weight syndiotactic 1,2-polybutadiene ("JSR-RB-810"), 20 parts of a low molecular weight atactic 1,2-polybutadiene ("NISSO-PB-B 1000"), 100 parts of 2,2-bis4-acryloyl-3,5-dibromophenyl)propane and 6 parts of 2,5-dimethyl-2,5-t-butylperoxyhexine-3 in 600 parts of trichloroethylene. Non-tacking prepregs were obtained by impregnation of glass cloth substrates ("Nittobo WE-116E-104") and non-woven glass fabric substrates ("EP-4050" supplied by Japan Vilene Co., Ltd.) with the varnish, followed by 10 minutes drying at 120° C.

Six prepregs made from non-woven glass fabric were stacked and sandwiched between two glass cloth prepregs. The assembly was cured for two hours to a prepreg laminate at a temperature of 200° C. and a pressure of 40 Kg/cm².

EXAMPLE 15

Glass cloth prepregs were prepared in the manner as described in Example 13 from a varnish composed of 100 parts of a high molecular weight syndiotactic 1,2-polybutadiene ("JSR-RB 810"), 20 parts of a low molecular weight atactic 1,2-polybutadiene ("NISSO-PB-B 3000"), 120 parts of 2,2-bis(4-methacryloyl-3,5-dibromophenyl)propane, 120 parts of styrene, 6 parts of 1,1-bis(t-butylperoxy)-3,3,5-trimethylcohexane and 750 parts of trichloroethylene.

Eight prepregs so prepared were stacked and the stack was sandwiched between two electrolytic copper foils (supplied by Furukawa Circuit Foil Co., Ltd.). The assembly was cured for 1 hour to a copper clad laminate at a temperature of 180° C. and a pressure of 50 Kg/cm². The addition of styrene allowed the required cure time to be reduced to 1 hour. The strength for peeling the copper foil was 1.0 Kg/cm².

Control 1

This is a control example wherein no flame retardant was used.

Following the procedure as described in Example 12, a prepreg laminate was prepared using a varnish composed of 100 parts of a high molecular weight syndiotactic 1,2-polybutadiene ("JSR-RB- 810"), 40 parts of a cyclized 1,4-polybutadiene ("JSR-CLBR" provided by Japan Synthetic Rubber Co., Ltd.; this component was added to impart flexibility to the product), 5 parts of dicumyl peroxide and 600 parts of trichloroethylene.

Control 2

This is a control example wherein a monofunctional reactive flame retardant was used instead of the difunctional reactive flame retardant according to the invention.

Following the procedure as described in Example 12, a prepreg laminate was prepared using a varnish composed of 100 parts of a high molecular weight syndiotactic 1,2-polybutadiene ("JSR-PB 810"), 100 parts of 2,4,6-tribromophenyl acrylate, 6 parts of dicumyl peroxide and 650 parts of trichloroethylene.

The product prepared in Examples 12 through 15 and Controls 1 and 2 were tested for various properties.

The volume resistivity (in $\Omega$ cm), insulation resistance (in $\Omega$), dielectric constant (with 1 $MH_Z$ at 25° C.), dielectric loss tangent (with 1 MHZ at 25° C.), solder bath heat resistance (minimum time in seconds required for the sample floated on a solder bath at 260° C. or 300° C. to blister) and triclene resistance were measured in accordance with JIS C 6481. The flame retardancy performance was measured according to the Underwriters Laboratories Standard UL 94 using the Vertical Burning Test.

Results are shown in Table 3.

TABLE 3

|  | Example 12 | Example 13 | Example 14 | Example 15 | Control 1 | Control 2 |
|---|---|---|---|---|---|---|
| Resin content (wt %) | 42 | 45 | 68 | 45 | 45 | 45 |
| Volume resistivity ($\Omega$-cm) | $1.4 \times 10^{15}$ | $3.0 \times 10^{15}$ | $1.0 \times 10^{15}$ | $1.0 \times 10^{15}$ | $1.0 \times 10^{15}$ | $1.0 \times 10^{15}$ |
| Insulation resistance ($\Omega$) | $1.0 \times 10^{15}$ | $1.2 \times 10^{15}$ | $1.0 \times 10^{15}$ | $1.0 \times 10^{15}$ | $1.8 \times 10^{15}$ | $2.7 \times 10^{14}$ |
| Dielectric constant (1 MHZ) | 3.38 | 3.35 | 2.88 | 3.37 | 3.20 | 3.42 |
| Dielectric loss tangent (1 MHZ) | 0.003 | 0.003 | 0.002 | 0.003 | 0.004 | 0.004 |
| Solder heat 260° C. | 300 | 300 | 300 | 300 | 300 | 120 |
| resistance (sec) 300° C. | 120 | 120 | 120 | 120 | 120 | Blistering |
| Triclene resistance | no change | no change | no change | no change | no change | no change |
| UL 94 rating | UL 94 V-1 | UL 94 V-1 | UL 94 V-1 | UL 94 V-1 | Burning | UL 94 HB |

UL 94-HB: Selfextinguishing upon first ignition, but burning upon second ignition.

EXAMPLE 16

Using prepregs prepared as in Example 15, a six-layered circuit board was prepared. Three prepregs were stacked and sandwiched by two copper foils. The assembly was cured under heat and pressure as in Example 15 to form a copper clad laminate having a thickness of 0.38 mm, which was then provided with circuit patterns of the width level of 0.2 mm by a usual etching technique. Three such patterned copper clad laminates were stacked, with two prepregs between each adjacent pair of laminates. The assembly was pressed for 1 hour at a temperature of 180° C. and a pressure of 60 Kg/cm² to provide the desired multi-layered circuit board.

The product exhibited the same general properties as those indicated in Table 3 in the column designated as Example 15. For the inner layer circuit pattern, the characteristics impedance was 84 $\Omega$ and the propagation delay time was 5.0 ns/m. For the same circuit pattern formed in a flame retarded epoxy resin circuit board FR-4 of the same thickness, the characteristic impedance was 75 and the propagation delay time was 5.8 ns/m.

EXAMPLE 17

A varnish was prepared by dissolving 80 parts of a high molecular weight syndiotactic 1,2-polybutadiene ("JSR-RB 810"), 60 parts of N,N'-4,4'-diphenylmethane bismaleimide, 60 parts of 2,2-bis(4-mathacryloyl-3,5-dibromophenyl)propane and 10 parts of dicumyl peroxide in 1000 parts of tetrahydrofuran. A glass cloth was impregnated with the varnish and dried at 100° C. for 10 minutes to a non-tacky prepreg.

Eight prepregs so prepared were stacked and sandwiched between copper foils. The assembly was cured for 1 hour at a temperature of 180° C. and a pressure of 40 Kg/cm² to provide a copper clad laminate.

EXAMPLE 18

The procedures described in Example 17 were repeated using a varnish prepared by dissolving 80 parts of a high molecular weight syndiotactic, 1,2-polybutadiene ("JSR-RB 810"), 60 parts of an equimolar reaction product of N,N'-4,4'-diphenylmethane bismaleimide and 4,4'-diaminodiphenylamine, 60 parts of 2,2-bis(4-methacryloyl-3,5-dibromophenyl)propane, 8 parts of dicumyl peroxide and 2 parts of benzoyl peroxide in 1,000 parts of tetrahydrofuran.

EXAMPLE 19

A varnish was prepared by dissolving 60 parts of a high molecular weight syndiotactic 1,2-polybutadiene, 60 parts of "Bismaleimide M" as used in Example 7, 60 parts of 2,2-bis(4-methacryloyl-3,5-dibromophenyl)propane, 8 parts of dicumyl peroxide and 2 parts of benzoyl peroxide in 1000 parts of tetrahydrofuran.

Using the varnish so prepared, a copper clad laminate was prepared in the manner as described in Example 17.

Properties of the products of Example 17, 18 and 19 are shown in Table 4.

TABLE 4

|  | Example 17 | Example 18 | Example 19 |
|---|---|---|---|
| Dielectric constant (1MHz) | 3.68 | 3.64 | 3.68 |
| Dielectric loss tangent (1MHz) | 0.005 | 0.005 | 0.005 |
| Insulation resistance ($\Omega$) | $8.2 \times 10^{14}$ | $8.4 \times 10^{14}$ | $8.2 \times 10^{14}$ |
| Solder heat resistance (300° C., 120 sec.) | no change | no change | no change |
| Triclene resistance | no change | no change | no change |
| UL 94 rating | UL 94 V-1 | UL 94 V-1 | UL 94 V-1 |
| average burn time (sec) | 9.6 | 10.5 | 9.6 |
| maximum burn time (sec) | 18.8 | 21.3 | 18.3 |

EXAMPLE 20

A copper clad laminate was prepared in the manner as described in Example 17 using a varnish prepared by dissolving 100 parts of the curable putty-like composition, as prepared in Example 8, in 500 parts of tetrahydrofuran.

EXAMPLE 21

Using a varnish prepared by dissolving 100 parts of the curable composition, as prepared in Example 9, in 500 parts of tetrahydrofuran, a copper clad laminate was prepared following the procedures of Example 17.

Properties of the products obtained in Examples 20 and 21 are shown in Table 5.

TABLE 5

| | Example 20 | Example 21 |
|---|---|---|
| Volume resistivity (Ω cm) | $1.6 \times 10^{15}$ | $1.0 \times 10^{15}$ |
| Insulation resistance (Ω) | $1.2 \times 10^{15}$ | $1.0 \times 10^{15}$ |
| Dielectric constant (1MHz) | 3.8 | 3.6 |
| Dielectric loss tangent (1MHz) | 0.008 | 0.007 |
| Solder heat resistance (sec.) 260° C. | 300 | 300 |
| 300° C. | 120 | 120 |
| Triclene resistance | no change | no change |
| UL 94 rating | UL 94 V-1 | UL 94 V-1 |
| Thermal expansion coefficient (1/°C.) | $6 \times 10^{-5}$ | $7 \times 10^{-5}$ |

EXAMPLES 22 and 23

Copper clad laminates were prepared in the manner as described in Example 17 using varnishes prepared by dissolving 100 parts of the curable compositions, as prepared in Examples 10 and 11, in 600 parts of tetrahydrofuran.

Properties of the products are shown in Table 6.

TABLE 6

| | Example 22 (Example 10) | Example 23 (Example 11) |
|---|---|---|
| Dielectric constant (1MHz, 25° C.) | 3.75 | 3.71 |
| Dielectric loss tangent (1MHz, 25° C.) | 0.008 | 0.007 |
| Insulation resistance (Ω) | $8.0 \times 10^{14}$ | $8.2 \times 10^{14}$ |
| Solder heat resistance (300° C., 120 sec) | no change | no change |
| Triclene resistance | no change | no change |
| Thermal expansion coeff. (1/°C.) | $6.8 \times 10^{-5}$ | $5.9 \times 10^{-5}$ |
| UL 94 rating | UL 94 V-1 | UL 94 V-1 |
| average burn time (sec) | 6.0 | 8.5 |
| maximum burn time (sec) | 12.8 | 11.4 |

What we claim is:

1. A composition curable to a flame-retarded resin material, comprising:
   (A) a polybutadiene polymer wherein at least 50% of the recurring units consist of 1,2-butadiene units;
   (B) 40 to 200 parts by weight, based on 100 parts by weight of said butadiene polymer, of at least one reactive flame retardant selected from the group consisting of bisphenol bisacrylate compounds having the formula:

$$CH_2=C-C-O-\underset{X_m}{\phantom{X}}\phantom{X}\text{—}A\text{—}\underset{X_n}{\phantom{X}}\phantom{X}\text{—}O-C-C=CH_2$$

wherein X is Br or Cl, Y is H or $-CH_3$, m and n each is an integer from 1 through 4, and A is a direct bond, $-O-$, $-CO-$, $-SO_2-$, $-(CH_2)_b-$, wherein b is an integer from 1 through 4, $-CH=CH-$ or $$-\underset{CH_3}{\overset{CH_3}{\underset{|}{\overset{|}{C}}}}-$$

and polymers of such bisphenol bisacrylate compounds, and;
   (C) a curing-promoting amount of an organic peroxide.

2. The composition in accordance with claim 1, wherein at least 80% of the recurring units of said butadiene polymer consist of 1,2-butadiene units, and wherein said reactive flame retardant is present in an amount from 60 to 120 parts by weight based on 100 parts by weight of said butadiene polymer.

3. The composition in accordance with claim 2, wherein said reactive flame retardant is selected from the group consisting of bisphenol bisacrylate compounds having the formula:

$$CH_2=C-C-O-\underset{Br_m}{\phantom{X}}\phantom{X}\text{—}A'\text{—}\underset{Br_n}{\phantom{X}}\phantom{X}\text{—}O-C-C=CH_2$$

wherein A' is $-SO_2-$ or $$-\underset{CH_3}{\overset{CH_3}{\underset{|}{\overset{|}{C}}}}-,$$

and Y, m and n have the same meaning as defined in claim 1, and polymers of such bisphenol bisacrylate compounds.

4. The composition in accordance with claim 3, wherein said reactive flame retardant is 2,2-bis(4-methacryloyl-3,5-dibromophenyl)propane or its polymer.

5. The composition in accordance with claim 1, which further comprises 10 to 150 parts by weight, based on 100 parts by weight of said butadiene polymer, of at least one modifier selected from the group consisting of bismaleimide compounds having the formula:

$$\begin{matrix} CH-CO \\ \| \phantom{XX} \diagdown \\ \phantom{XX} \phantom{X} N-R-N \\ \| \phantom{XX} \diagup \\ CH-CO \end{matrix} \begin{matrix} CO-CH \\ \diagdown \phantom{XX} \| \\ \phantom{XX} \phantom{X} \\ \diagup \phantom{XX} \| \\ CO-CH \end{matrix}$$

wherein R is a divalent aromatic radical having up to 70 carbon atoms, and polymers of such bismaleimide compounds.

6. The composition in accordance with claim 5, wherein said modifier is present in an amount from 30 to 100 parts by weight based on 100 parts by weight and said butadiene polymer.

7. A cured flame retarded resin material exhibiting a flame retardancy performance of at least V-1, as measured according to the Underwriters Laboratories Standard UL 94 using the Vertical Burning Test, said material being obtained by curing a composition comprising:
   (A) A polybutadiene polymer wherein at least 50% of the recurring units consist of 1,2-butadiene units;
   (B) 40 to 200 parts by weight, based on 100 parts by weight of said butadiene polymers, of at least one reactive flame retardant selected from the group consisting of bisphenol bisacrylate compounds having the formula:

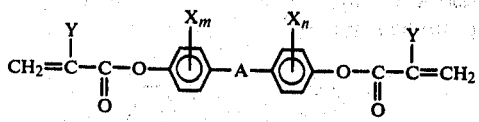

wherein X is Br or Cl, Y is H or —CH$_3$, m and n each is an integer from 1 to 4, and A is a direct bond, —O—, —CO—, —SO$_2$—, —(CH$_2$)$_b$—, wherein b is an integer of 1 through 4, —CH═CH— or

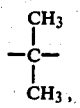

polymers of such bisphenol bisacrylate compounds, and;

(C) a curing-promoting amount of an organic peroxide.

8. The resin material in accordance with claim 7, wherein at least 80% of the recurring units of said butadiene polymer consist of 1,2-butadiene units, and wherein said reactive flame retardant is present in said curable composition in an amount from 60 to 120 parts by weight based on 100 parts by weight of said butadiene polymer.

9. The resin material in accordance with claim 8, wherein said reactive flame retardant is selected from the group consisting of bisphenol bisacrylate compounds having the formula:

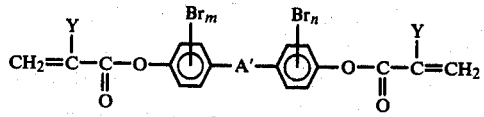

wherein A' is —SO$_2$— or

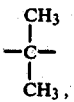

and Y, m and n have the same meanings as defined in claim 7, and polymers of such bisphenols bisacrylate compounds.

10. The resin-material in accordance with claim 9, wherein said reactive flame retardant is 2,2-bis(4-methacryloyl-3,5-dibromophenyl)propane or its polymer.

11. The resin material in accordance with claim 7, wherein said resin has a thermal expansion coefficient of less than $1\times10^{-4}/°$ C., and wherein said curable composition further comprises 10 to 150 parts by weight, based on 100 parts by weight of said butadiene polymer, of at least one modifier selected from the group consisting of bismaleimide compounds having the formula:

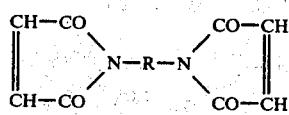

wherein R is a divalent aromatic radical having up to 70 carbon atoms, and polymers of such bismaleimide compounds.

12. The resin material in accordance with claim 11, wherein said modifier is present in said curable composition in an amount of 30 to 100 parts by weight based on 100 parts by weight of said butadiene polymer.

13. The resin material of claim 8, wherein said resin has a thermal expansion coefficient of less than $1\times10^{-4}/°$ C., and wherein said curable composition further comprises 10 to 150 parts by weight, based on 100 parts by weight of said butadiene polymer, of at least one modifier selected from the group consisting of bismaleimide compounds having the formula:

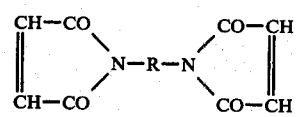

wherein R is a divalent aromatic radical having up to 70 carbon atoms, and polymers of such bismaleimide compounds.

14. The resin material of claim 9, wherein said resin has a thermal expansion coefficient of less than $1\times10^{-4}/°$ C., and wherein said curable composition further comprises 10 to 150 parts by weight, based on 100 parts by weight of said butadiene polymer, of at least one modifier selected from the group consisting of bismaleimide compounds having the formula:

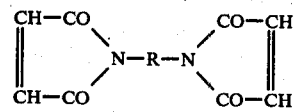

wherein R is a divalent aromatic radical having up to 70 carbon atoms, and polymers of such bismaleimide compounds.

15. The resin material of claim 10, wherein said resin has a thermal expansion coefficient of less than $1\times10^{-4}/°$ C., and wherein said curable composition further comprises 10 to 150 parts by weight, based on 100 parts by weight of said butadiene polymer, of at least one modifier selected from the group consisting of bismaleimide compounds having the formula:

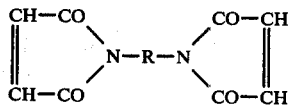

wherein R is a divalent aromatic radical having up to 70 carbon atoms, and polymers of such bismaleimide compounds.

16. The resin material of claim 13, wherein said modifier is present in said curable composition in an amount of 30 to 100 parts by weight based on 100 parts by weight of said butadiene polymer.

17. The resin material of claim 14, wherein said modifier is present in said curable composition in an amount of 30 to 100 parts by weight based on 100 parts by weight of said butadiene polymer.

18. The resin material of claim 15, wherein said modifier is present in said curable composition in an amount of 30 to 100 parts by weight based on 100 parts by weight of said butadiene polymer.

19. The composition of claim 2 comprising 10 to 150 parts by weight, based on 100 parts by weight of said butadiene polymer, of at least one modifier selected from the group consisting of bismaleimide compounds having the formula:

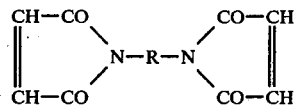

wherein R is a divalent aromatic radical having up to 70 carbon atoms, and polymers of such bismaleimide compounds.

20. The composition of claim 3 comprising 10 to 150 parts by weight, based on 100 parts by weight of said butadiene polymer, of at least one modifier selected from the group consisting of bismaleimide compounds having the formula:

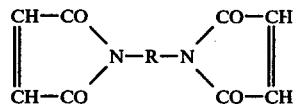

wherein R is a divalent aromatic radical having up to 70 carbon atoms, and polymers of such bismaleimide compounds.

21. The composition of claim 4 comprising 10 to 150 parts by weight, based on 100 parts by weight of said butadiene polymer, of at least one modifier selected from the group consisting of bismaleimide compounds having the formula:

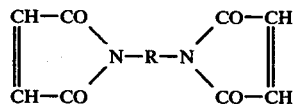

wherein R is a divalent aromatic radical having up to 70 carbon atoms, and polymers of such bismaleimide compounds.

22. The composition of claim 19, wherein said modifier is present in an amount from 30 to 100 parts by weight based on 100 parts by weight of said butadiene polymer.

23. The composition of claim 20, wherein said modifier is present in an amount from 30 to 100 parts by weight based on 100 parts by weight of said butadiene polymer.

24. The composition of claim 21, wherein said modifier is present in an amount from 30 to 100 parts by weight based on 100 parts by weight of said butadiene polymer.

25. The composition in accordance with claims 6, 22, 23 or 24 wherein said modifier is selected from the group consisting of bismaleimide compounds having the formula:

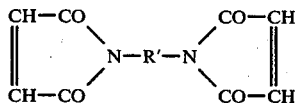

wherein R' is a divalent aromatic radical selected from the group consisting of

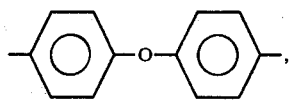

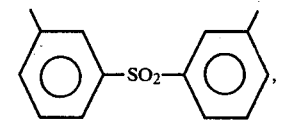

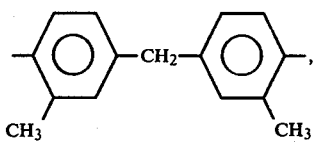

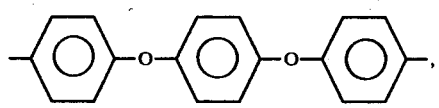

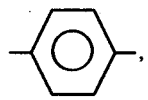

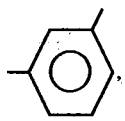

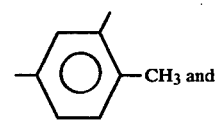

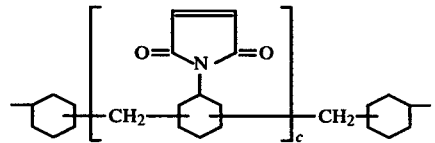

wherein c is an integer from 0 through 5, and at least one polymer of such bismaleimide compounds.

26. The resin material in accordance with claim 12, 16, 17 or 18 wherein said modifier is selected from the group consisting of bismaleimide compounds having the formula:

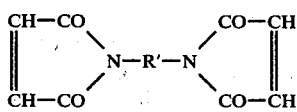

wherein R' represents a divalent aromatic radical selected from the group consisting of

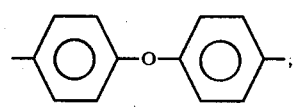

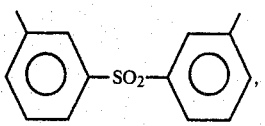
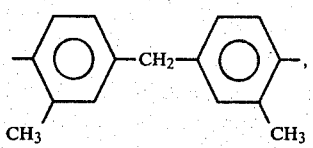
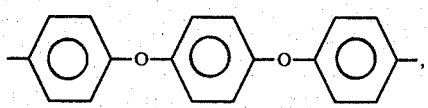
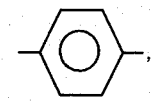
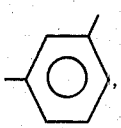
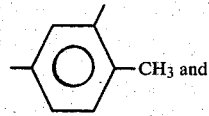
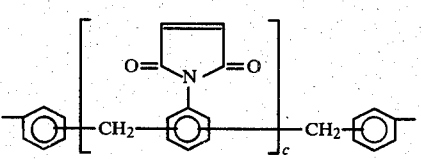
wherein c is an integer from 0 through 5, and polymers of such bismaleimide compounds.
* * * * *

UNITED STATES PATENT AND TRADEMARK OFFICE
CERTIFICATE OF CORRECTION

PATENT NO. : 4,268,433
DATED : May 19, 1981
INVENTOR(S) : Sawatari et al.

It is certified that error appears in the above—identified patent and that said Letters Patent is hereby corrected as shown below:

Front page, Item (73) should read -- Fujitsu Limited, Nakahara-Ku, Kawasaki-shi, Kanagawa, Japan --.
Item (56) the date for USP 3,153,014 should be -- 10/1964 --.
Item (57) line 11, "a half" should be -- half --.

*Column 1, line 27, "a printed circuits board," should be --printed circuit boards,--.

Column 2, line 25, "m and n" should be --$m$ and $n$-- (italicized); *each is" should be --are each--;

line 27, "b is" should be --$b$ is-- (italicized);

line 28, after "CH-" insert --or--;

line 34, at the bottom of the structural formula, "CH$_3$," should be --CH$_3$, and--;

line 37, a new paragraph should be started with --A preferred--;

line 61, "C." should be --C--.

Column 3, line 22, "C." should be --C--;

line 33, in the middle, bracketed section of the structural formula, "CH" (with CH$_2$ below) should be --CH-- (with CH$_2$ below, double bond);

lines 38 and 39, "n" should be --$n$-- (italicized);

UNITED STATES PATENT AND TRADEMARK OFFICE
CERTIFICATE OF CORRECTION

PATENT NO. : 4,268,433

DATED : May 19, 1981

INVENTOR(S) : Sawatari et al.

It is certified that error appears in the above—identified patent and that said Letters Patent is hereby corrected as shown below:

line 39, "m" should be --$m$-- (italicized);

line 40, "m's" should be --$m$'s-- (italicized).

Column 4, line 14, "m and n" should be --$m$ and $n$-- (italicized);

line 31, "procedure" should be --procedures--.

Column 5, line 15, "C.)" should be --C)--;

in the last structural formula in the column, before "and" insert --,--.

Column 6, line 12, "N,N'-m-phenylene-bismaleimide," should be --N,N'-$m$-phenylene-bismaleimide,-- (italicized);

line 13, "N,N'-p-phenylene-bismaleimide," should be --N,N'-$p$-phenylene-bismaleimide,--;

*line 15, "and;" should be --and--;

line 16, "N,N'-4,4'-m-xylene-bismaleimide." should be --N,N'-4,4'-$m$-xylylene-bismaleimide.--;

lines 21, 55 (two occurrences) and 59, "C." should be --C--;

line 31, "n" should be --$n$-- (italicized); *"through" should be --to--;

line 47, after "of" insert --a--.

Column 7, lines 13, 14, 31, 32, and 64 (first four occurrences), "C." should be --C--;

line 64, "16° C. one" should be --160° C (one--.

UNITED STATES PATENT AND TRADEMARK OFFICE
CERTIFICATE OF CORRECTION

PATENT NO. : 4,268,433
DATED : May 19, 1981
INVENTOR(S) : Sawatari et al.

It is certified that error appears in the above—identified patent and that said Letters Patent is hereby corrected as shown below:

Column 8, lines 10, last line of text in Tables 1 and 2, and 52, "C." should be --C--;

Table 1, between lines 20 and 21 (between the lines starting "Dicumylperoxide" and "Flame", a line should be drawn the length of the table;

line 57, delete "as";

Table 2, between the lines beginning "Perhexine" and "Flame" a line should be drawn the length of the table.

Column 9, line 11, "3,3/,5,5'-tetrabromodiphenylmethane." should be --3,3',5,5'-tetrabromodiphenylmethane.--;

*line 22, "ryloyl-3,3',5,5'5tetrabromodiphenylsulfon" should be --ryloyl-3,3',5,5'tetrabromodiphenylsulfon--;

*line 30, "was" should be --were--;

lines 33 (two occurrences), 38, 39, 41, 51, 52, 63, 64, and 66, "C." should be --C--;

line 48, "was" should be --were--.

Column 10, line 17, "n" should be --$\underline{n}$-- (italicized);

*"through" should be --to--;

lines 20 (two occurrences), 22, 30, 44, 53, 56, 62, 63, "C." should be --C--;

*line 20, "tagent" should be --tangent--;

UNITED STATES PATENT AND TRADEMARK OFFICE
CERTIFICATE OF CORRECTION

PATENT NO. : 4,268,433
DATED : May 19, 1981
INVENTOR(S) : Sawatari et al.

It is certified that error appears in the above—identified patent and that said Letters Patent is hereby corrected as shown below:

*line 26, "For a" should be --For--;

*line 50, "was" should be --were--;

*line 64, after "dance" insert --with--.

Column 11, line 1, "Example" should be --EXAMPLE--;

lines 12, 13, 22, 25, 26, 27 (five occurrences), 35, 36, 50, 51, 63, and 68, "C." should be --C--;

line 25, "deareated." should be --deaerated.--;

line 58, "("JSR-PB810")," should be --("JSR-PB 810"),--; *"2,2-ibs(4-methacryloyl-3,5-" should be --2,2-bis(4-methacryloyl-3,5- --;

line 61, "WE-116E-103")" should be --WE-116E-103"--.

Column 12, line 12, a space should be inserted between "," and "7";

lines 14, 36, and 53, "C." should be --C--;

line 25, "2,2-bis4-acryloyl-3,5-dibromophenyl)" should be --2,2-bis(4-acryloyl-3,5-dibromophenyl)--.

Column 13, line 13, "product" should be --products--;

lines 16, 17, 19 (two occurrences) and 51, "C." should be --C--;

*line 43, "by" should be --between--;

line 57, "characteristics" should be --characteristic--;

UNITED STATES PATENT AND TRADEMARK OFFICE
CERTIFICATE OF CORRECTION

PATENT NO. : 4,268,433
DATED : May 19, 1981      PAGE 5 OF 7
INVENTOR(S) : Sawatari et al.

It is certified that error appears in the above-identified patent and that said Letters Patent is hereby corrected as shown below:

line 68, "2,2-bis(4-mathacryloyl-3,5-" should be --2,2-bis(4-methacryloyl-3,5- --.
Column 14, lines 3 and 7, "C." should be --C--;
line 13, "syndiotactic," should be --syndiotactic--;
*line 65, delete "as".
*Table 3, first column, line 7, "260° C." should be --260° C--;
line 8, "resistance (sec) 300° C." should be --Resistance (sec) 300° C--.
Column 15, Table 5, lines 5, 6, and 9, "C." should be --C--;
Table 6, lines 1, 3, 5 and 8, "C." should be --C--;
line 59, "m and n" should be --m and n-- (italicized); *before "each" insert --are--;
line 61, "b" should be --b-- (italicized).
Column 16, line 30, "m and n have the same meaning" should be --m and n have the same meanings--;
line 54, "and" should be --of--;
line 65, "polymers," should be --polymer,--.
Column 17, line 8, "m and n" should be --m and n-- (italicized);

UNITED STATES PATENT AND TRADEMARK OFFICE
CERTIFICATE OF CORRECTION

PATENT NO. : 4,268,433
DATED : May 19, 1981  PAGE 6 OF 7
INVENTOR(S) : Sawatari et al.

It is certified that error appears in the above—identified patent and that said Letters Patent is hereby corrected as shown below:

\*line 9, "each is" should be --are each--;

line 11, "b" should be --$\underline{b}$-- (italicized);

\*"through" should be --to--;

line 19, insert "and" at the beginning of the line;

line 48, "m and n" should be --$\underline{m}$ and $\underline{n}$-- (italicized);

line 49, "bisphenols" should be --bisphenol--;

line 57, "C." should be --C--.

Column 18, lines 10, 27, and 44, "C." should be --C--.

\*Column 19, line 59, "24" should be --24,--.

\*Column 20, the seventh structural formula, after "-$CH_3$" insert --,--;

line 47, the last structural formula in claim 25, in the lower row insert a circle within each of the three hexagons;

UNITED STATES PATENT AND TRADEMARK OFFICE
CERTIFICATE OF CORRECTION

PATENT NO. : 4,268,433

DATED : May 19, 1981   PAGE 7 OF 7

INVENTOR(S) : Sawatari et al.

It is certified that error appears in the above—identified patent and that said Letters Patent is hereby corrected as shown below:

line 52, change "18" to --18,--.

Column 22, line 15, in the third structrual formula, after "-$CH_3$" insert --,--;

line 25, "c is" should be --$\underline{c}$ is-- (italicized);

"through" should be --to--.

Signed and Sealed this

Eighth Day of December 1981

[SEAL]

Attest:

Attesting Officer

GERALD J. MOSSINGHOFF

Commissioner of Patents and Trademarks